US012232302B2

(12) United States Patent
Ng et al.

(10) Patent No.: US 12,232,302 B2
(45) Date of Patent: Feb. 18, 2025

(54) DIPPED COATED ELECTRONIC MODULE ASSEMBLY WITH ENHANCED THERMAL DISTRIBUTION

(71) Applicant: Infineon Technologies Austria AG, Villach (AT)

(72) Inventors: Chee Yang Ng, Muar (MY); Swee Kah Lee, Melaka (MY)

(73) Assignee: Infineon Technologies Austria AG, Villach (AT)

( * ) Notice: Subject to any disclaimer, the term of this patent is extended or adjusted under 35 U.S.C. 154(b) by 236 days.

(21) Appl. No.: 18/146,130

(22) Filed: Dec. 23, 2022

(65) Prior Publication Data

US 2024/0215208 A1   Jun. 27, 2024

(51) Int. Cl.
*H05K 7/20* (2006.01)
*H01L 23/31* (2006.01)
*H01L 25/16* (2023.01)

(52) U.S. Cl.
CPC ......... *H05K 7/209* (2013.01); *H01L 23/3107* (2013.01); *H01L 25/16* (2013.01)

(58) Field of Classification Search
CPC ...... H05K 7/209; H01L 23/3107; H01L 25/16
See application file for complete search history.

(56) References Cited

U.S. PATENT DOCUMENTS 6,255,738 B1 * 7/2001 Distefano ........... H01L 23/4985
257/788
8,276,268 B2 * 10/2012 Kapusta ................. H05K 1/181
29/846

2004/0212965 A1 * 10/2004 Ishii ................... H01L 23/49531
257/E23.098
2010/0202111 A1 * 8/2010 Liang ..................... H05K 5/064
361/720
2016/0083304 A1    3/2016 Mironets et al.
2020/0357717 A1 * 11/2020 Maier ................... H01L 25/115

OTHER PUBLICATIONS

Coatings: Product Line Overview, ASK Chemicals, Jun. 2019, 16 pages.
Cyntec High Efficiency POL Module, HM10107A Data Sheet, HM Series, Jun. 2010, 24 pages.

(Continued)

*Primary Examiner* — Mukundbhai G Patel
(74) *Attorney, Agent, or Firm* — Harrity & Harrity, LLP

(57) ABSTRACT

A method of manufacturing an electronic module assembly includes forming the electronic module assembly, wherein the electronic module assembly comprises a plurality of internal exposed surfaces, a plurality of external exposed surfaces, at least one internal cavity, and an internal heat source configured to generate heat internally within the electronic module assembly; dipping the electronic module assembly into a thermally conductive material to coat the plurality of internal exposed surfaces and the plurality of external exposed surfaces and to at least partially fill the at least one internal cavity; and curing the thermally conductive material formed on the plurality of internal exposed surfaces and the plurality of external exposed surfaces and filled within the at least one internal cavity to form a thermally conductive layer, wherein the thermally conductive layer is formed as a one-piece integral member.

16 Claims, 4 Drawing Sheets

(56) References Cited

OTHER PUBLICATIONS

Cyntec VR13 Digital Power Module, MSN12VD30-FR-VDC1, MSN12VD30-FR-VDA1 & MSN12VD30-FR-VDT1 Data Sheet, Rev. 15, Aug. 19, 2022, 24 pages.

Dipping—Process of Coatings, ASK Chemicals, 7 pages. [Retrieved on Mar. 14, 2019 from https://www.youtube.com/watch?v=0ft4Auzw55A].

Liu et al., "High thermal conductivity and high energy density compatible latent heat thermal energy storage enabled by porous AlN ceramics composites," International Journal of Heat and Mass Transfer, vol. 175, Aug. 2021, 11 pages.

Frazor, "Power Solution Options for Data Center Applications," Texas Instruments, Dec. 2018, 11 pages.

Júnior et al., "Thermal conductivity of polycrystalline aluminum nitride (AlN) ceramics," Cerâmica, vol. 50, Sep. 2004, pp. 247-253.

TPSM846C23 Data Sheet, Product Information and Support, 7 pages. [Retrieved on Oct. 13, 2022 from https://www.ti.com/product/TPSM846C23#description].

TPSM846C23 4.5-V to 15-V Input, 0.35-V to 2-V Output, 35-A PMBus™ Power Module, Texas Instruments, SLVSDF3F, Mar. 2017 (Revised Jan. 2019), 93 pages.

\* cited by examiner

DIPPED COATED ELECTRONIC MODULE ASSEMBLY WITH ENHANCED THERMAL DISTRIBUTION

BACKGROUND

Increasing power demand of modern processors combined with variable and decreasing point-of-load voltages drives load currents to very high levels, with current peaks of 1000 A and higher becoming common. In addition, the dynamic requirements on load jumps, specifically sudden increases of load currents, are very challenging to address. As the capability of modern processors to perform additional computational calculations is mainly thermally limited, a precise regulation of the voltage at the interface to the processor becomes increasingly important. With the power dissipation of processors basically scaling with the square of the input voltage, a lowering of the input voltage closer to the threshold of catastrophic processor failure enables processors to run cooler and take additional computational tasks, making precise voltage regulation even more important.

SUMMARY

In some implementations, an electronic module assembly includes a thermally conductive material formed as a one-piece integral member; a carrier substrate comprising a first plurality of external surfaces, wherein at least one of the first plurality of external surfaces is at least partially in contact with the thermally conductive material; a circuit substrate mounted to the carrier substrate, wherein the circuit substrate comprises a second plurality of external surfaces, wherein at least one of the second plurality of external surfaces is at least partially in contact with the thermally conductive material, wherein the circuit substrate comprises at least one active component configured to conduct a current, and wherein the at least one active component is electrically coupled to the carrier substrate and is configured to produce heat while conducting the current; and a passive component electrically coupled to the at least one active component and configured to conduct the current, wherein the passive component is mounted to at least one of the carrier substrate or the circuit substrate, and wherein the passive component comprises a third plurality of external surfaces, wherein at least one of the third plurality of external surfaces is at least partially in contact with the thermally conductive material, wherein the passive component is arranged relative to the circuit substrate to form at least one gap between at least one of the second plurality of external surfaces and at least one of the third plurality of external surfaces, wherein the thermally conductive material is integrally formed as a coating on the first plurality of external surfaces, the second plurality of external surfaces, and the third plurality of external surfaces, and integrally formed with the coating as the one-piece integral member to at least partially fill the at least one gap, and wherein the thermally conductive material is configured to establish at least one thermal conduit that is configured to transport the heat away from the at least one active component toward a periphery of the electronic module assembly.

In some implementations, an electronic module assembly includes a thermally conductive material formed as a one-piece integral member; a carrier substrate comprising a first plurality of external surfaces, wherein at least one of the first plurality of external surfaces is at least partially in contact with the thermally conductive material; a circuit substrate mounted to the carrier substrate, wherein the circuit substrate comprises a second plurality of external surfaces, wherein at least one of the second plurality of external surfaces is at least partially in contact with the thermally conductive material, wherein the circuit substrate comprises at least one active component electrically coupled to the carrier substrate and configured to produce heat while operating; and a conductor structure having a U-shape, the conductor structure comprising a main body, a first leg that extends from the main body to a first conductor end of the conductor structure, and a second leg that extends from the main body to a second conductor end of the conductor structure, wherein the main body, the first leg, and the second leg define an internal area, and wherein the conductor structure includes a third plurality of external surfaces, wherein the carrier substrate comprises a first peripheral region and a second peripheral region arranged opposite to the first peripheral region, wherein the first conductor end of the conductor structure is coupled to the first peripheral region of the carrier substrate, wherein the second conductor end of the conductor structure is coupled to the second peripheral region of the carrier substrate, wherein the circuit substrate is arranged within the internal area, wherein the thermally conductive material is integrally formed as a coating on the at least one of the first plurality of external surfaces, the at least one of the second plurality of external surfaces, and at least one of the third plurality of external surfaces, and wherein the thermally conductive material is configured to establish at least one thermal conduit that is configured to transport the heat away from the at least one active component to the conductor structure.

In some implementations, a method of manufacturing an electronic module assembly includes forming the electronic module assembly, wherein the electronic module assembly comprises a plurality of internal exposed surfaces, a plurality of external exposed surfaces, at least one internal cavity, and an internal heat source configured to generate heat internally within the electronic module assembly; dipping the electronic module assembly into a thermally conductive slurry to coat the plurality of internal exposed surfaces and the plurality of external exposed surfaces and to at least partially fill the at least one internal cavity; and curing the thermally conductive slurry formed on the plurality of internal exposed surfaces and the plurality of external exposed surfaces and filled within the at least one internal cavity to form a thermally conductive layer, wherein the thermally conductive layer is formed as a one-piece integral member.

BRIEF DESCRIPTION OF THE DRAWINGS

Implementations are described herein making reference to the appended drawings.

DETAILED DESCRIPTION

Figure 1A:
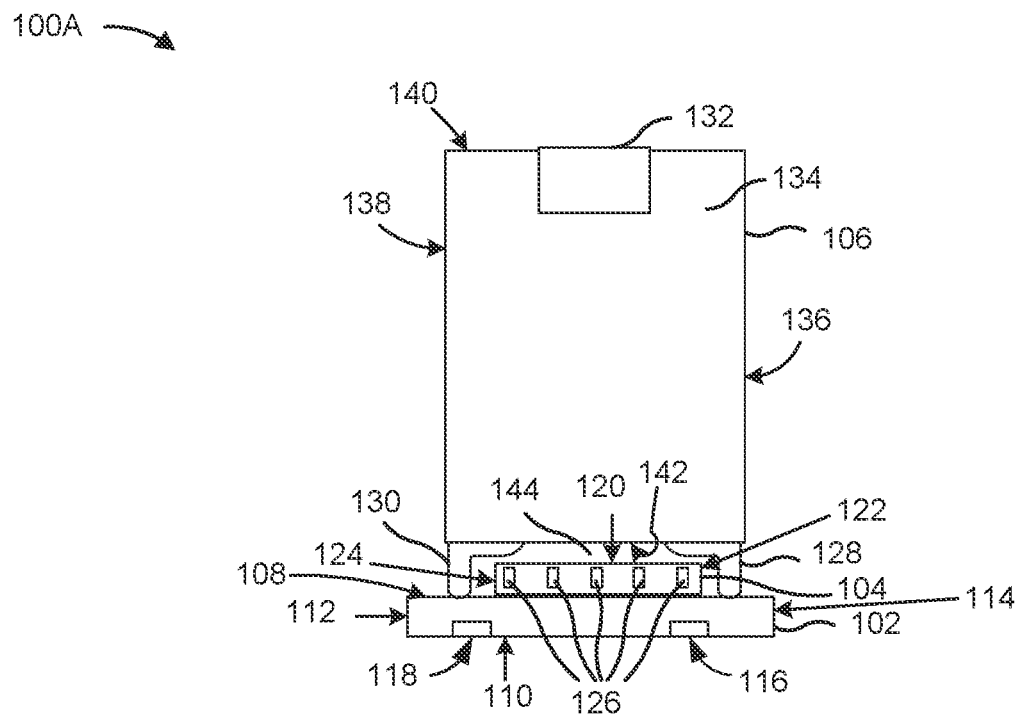
FIGS. 1A and 1B show an electronic module assembly according to one or more implementations.

In the following, details are set forth to provide a more thorough explanation of example implementations. However, it will be apparent to those skilled in the art that these implementations may be practiced without these specific details. In other instances, well-known structures and devices are shown in block diagram form or in a schematic view rather than in detail in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling, e.g., any connection or coupling without additional intervening elements, may also be implemented by an indirect connection or coupling, e.g., a connection or coupling with one or more additional intervening elements, or vice versa, as long as the general purpose of the connection or coupling, for example, to transmit a certain kind of signal or to transmit a certain kind of information, is essentially maintained. Features from different implementations may be combined to form further implementations. For example, variations or modifications described with respect to one of the implementations may also be applicable to other implementations unless noted to the contrary.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

Devices are becoming smaller and more compact, leading to higher power densities. A power stage module (e.g., a DC-to-DC power staging module, such as a DC/DC converter) is one example of a high-power device with a compact design. A power stage module typically includes at least one integrated power stage that contains a gate driver packaged with both high-side and low-side transistors. Large currents can be conducted through the high-side and low-side transistors. These active components generate heat while conducting the currents. Higher temperatures often accompany higher power densities. Moreover, more compact devices typically have less space and less thermal mass to absorb heat (e.g., less thermal capacitance), which can cause a thermal bottleneck. For example, some thermal dissipation paths may be smaller due to smaller spaces between components and are less efficient at dissipating heat. Accordingly, compact devices may not have enough space to store or buffer heat before the heat is able to be transferred out of the device. In some cases, fast discharge of heat may be needed to prevent overheating and component failure. Additionally, or alternatively, some thermal dissipation paths may be cut off, or blocked by other components, from cooler parts of the device or from a heat sink. Thus, it is becoming a challenge to improve thermal performances of these devices.

Some implementations disclosed herein are directed to an electronic module assembly that is dipped into a thermally conductive material in order to provide a thermally conductive coating or layer on one or more internal surfaces of the electronic module assembly and to at least partially fill one or more gaps locating internally within the electronic module assembly. Thus, the thermally conductive coating can provide one or more continuous thermal dissipation paths from a heat source to a cooler part of the electronic module assembly and/or to a heat sink of the electronic module assembly. Moreover, the thermally conductive material is an electrically isolating material that is configured to maintain electrical isolation between components of the electronic module assembly. The thermally conductive coating or layer is a one-piece integral member (e.g., formed as a one-piece integral structure) that is formed as one cohesive, continuous structure.

In some implementations, the thermally conductive coating or layer may be formed on one or more external surfaces of the electronic module assembly, thereby connecting the one or more external surfaces with the thermally conductive coating or layer arranged inside the electronic module assembly with at least one thermal dissipation path (e.g., a thermally conductive path configured to dissipate or otherwise distribute heat away from a heat source).

In some implementations, the thermally conductive coating or layer may completely fill one or more gaps located between components of the electronic module assembly by dipping the electronic module assembly in a bath or a slurry of the thermally conductive material. The thermally conductive coating or layer may be formed by dipping without masking (e.g., taping), thereby simplifying manufacturing process and lowering costs. In some implementations, the thermally conductive material may be a ceramic material (e.g., an aluminum-based ceramic, an aluminum nitride ceramic, a silicon nitride ceramic, or a silicon carbide ceramic). In some implementations, a silica coated aluminum nitride filler may be used as a core filler of the ceramic material. A liquid phase binder solution may be used to bind ceramic powder together without sintering. In this way, the binder constituents crystalize after drying (e.g., curing) and combine the ceramic powder together.

In some implementations, a viscosity of the thermally conductive coating or layer may be configured to partially fill one or more gaps or cavities and/or to entirely fill one or more gaps or cavities. For example, increasing the viscosity may enable a higher filling capability to fill or entirely fill one or more gaps or cavities. Decreasing the viscosity may decrease the filling capability of the thermally conductive material, but may save on material costs by using less material.

In some implementations, the thermally conductive coating or layer can be used to form multiple thermal dissipation paths that extend in multiple directions, in order to enhance heat dissipation in more directions.

In some implementations, the thermally conductive coating or layer may enhance electrical isolation between components of the electronic module assembly and may assist in managing creepage.

In some implementations, the thermally conductive material may have magnetic shielding properties to enhance magnetic shielding between components of the electronic module assembly.

In some implementations, the thermally conductive material may be configured to limit solder bleed if solder of the electronic module assembly is remelted during a subsequent manufacturing process or during operation of the electronic module assembly.

In some implementations, the thermally conductive coating or layer may prevent foreign material (e.g., conductive particles) from shorting components (e.g., between passive components and leads). In other words, by at least partially filling gaps between components of the electronic module assembly, the thermally conductive coating or layer may prevent shorts from forming between the components.

In some implementations, the thermally conductive coating or layer may provide the electronic module assembly with environmental protection by sealing the electronic module assembly from the environment.

In some implementations, the thermally conductive coating or layer may enable liquid cooling to be applied to the electronic module assembly while protecting the components of the electronic module assembly from the liquid (e.g., by sealing the electronic module assembly from the liquid to prevent the liquid from coming in contact with the components).

In some implementations, the thermally conductive coating or layer may structurally reinforce the electronic module assembly, which can improve an ability of the electronic module assembly to withstand drops or other types of impacts.

In some implementations, the electronic module assembly is a power stage module that is coated, at least in part, with the thermally conductive material. In some implementations, the power stage module is a voltage regulator module. The voltage regulator module may include at least one power stage that includes active devices, such as high-side and low-side transistors, that generate heat while conducting current. In some implementations, the voltage regulator module includes an inductor-cooled power stage. The voltage regulator module may include input terminals and output terminals at a same side of the voltage regulator module. An inductor embedded in a magnetic core has a first end electrically connected to switch node of a power stage included in the voltage regulator module. A conductor, such as a metal clip, may electrically connect a second end of the inductor to a power output terminal of the voltage regulator module, such that power is delivered to and from the voltage regulator module at the same side of the voltage regulator module. The inductor may provide effective cooling and a low-ohmic current path with minimum parasitic inductance. An output current may exit the power stage at one interface of the voltage regulator module and may be routed back to another interface by a low-ohmic path. More than one power stage may be included in the voltage regulator module to form a multi-phase arrangement for regulating an output voltage of a load.

Figure 1B:
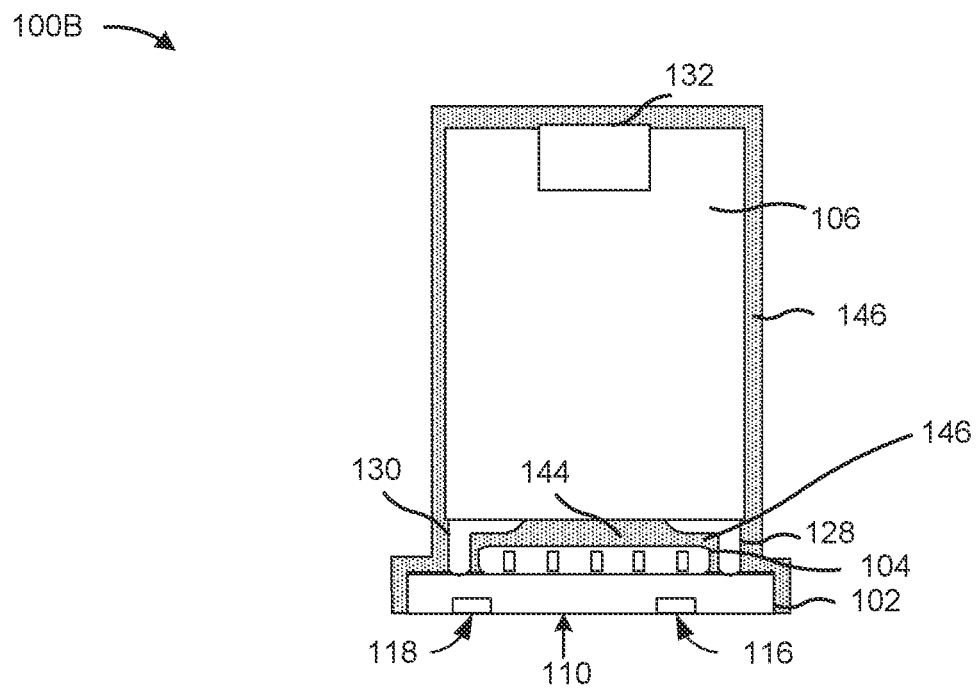

FIG. 1A shows an electronic module assembly 100A according to one or more implementations. FIG. 1B shows an electronic module assembly 100B after a dipping process according to one or more implementations. The electronic module assembly 100A is dipped into a thermally conductive material to form the electronic module assembly 100B. Thus, the electronic module assembly 100B includes all of the parts of the electronic module assembly 100A and is described in parallel with the description of the electronic module assembly 100A.

As shown in FIG. 1A, the electronic module assembly 100A includes a carrier substrate 102, a circuit substrate 104, and a passive component 106. The electronic module assembly 100A includes at least one active component (e.g., a transistor or a diode) that produces heat during operation. For example, an active component is a device that has an ability to amplify a signal or produce a power gain. In contrast, a passive component (e.g., a capacitor, an inductor, or a resistor) is a device that does not have the ability to amplify a signal or produce a power gain. In some implementations, the electronic module assembly 100A may be a power stage module, such as a voltage regulator module.

The carrier substrate 102 includes a first plurality of external (e.g., exposed) surfaces, including two opposing main surfaces (e.g., a top main surface 108 and a bottom main surface 110) and opposing side surfaces 112 and 114. The carrier substrate 102 may include contact pads arranged at the bottom main surface 110, including an input contact pad 116 that serves as a power input terminal and an output contact pad 118 that serves as a power output terminal. Additional contact pads, including a ground contact pad, may also be provided at the bottom main surface 110. The contact pads of the carrier substrate 102 may be configured to be connected to a further device or interface. The carrier substrate 102 may include conductive interconnects that are configured to carry one or more signals between the top main surface 108 and the bottom main surface 110. The carrier substrate 102 may be a system board such as a motherboard or an accelerator card with multiple processors, or an interposer such as a molded interconnect substrate, such as a printed circuit board (PCB), that attaches to a system board or another external device.

The circuit substrate 104 is mounted to the top main surface 108 of the carrier substrate 102 and is electrically connected to the carrier substrate 102 via corresponding contact pads and/or electrical (e.g., conductive) interconnect structures. For example, the circuit substrate 104 may be surface mounted to the top main surface 108 of the carrier substrate 102 by a plurality of electrical interconnects. The circuit substrate 104 comprises a second plurality of external (e.g., exposed) surfaces, including a top main surface 120 and opposing side surfaces 122 and 124. The circuit substrate 104 may be a multi-layer PCB that includes patterned metallization layers and interconnecting vias. The circuit substrate 104 may include at least one active component 126 configured to conduct a corresponding current. For example, the at least one active component 126 may be electrically coupled to the carrier substrate 102 to receive the current from the carrier substrate (e.g., from the input contact pad 116) and configured to produce heat while conducting the current.

In some implementations, the at least one active component 126 is a power switch (e.g., a power transistor) and the circuit substrate 104 includes at least two active components 126. For example, the circuit substrate 104 may include a pair of power switches, including a high-side transistor and a low-side transistor, for each phase current. Each pair of power switches may be connected together in a half-bridge configuration at a switch node through which the phase current is conducted. Additional elements such as a gate driver, a controller, a voltage sense element, and/or a current sense element may be attached to or embedded in the circuit substrate 104. Circuitry of the circuit substrate 104 may form a synchronous buck converter configured to receive an input voltage from the input contact pad 116 and provide the current (e.g., a phase current) to the passive component 106 at the switch node of a power stage formed by a pair of power switches.

The passive component 106 may be electrically coupled to the at least one active component 126 and configured to conduct the current received from the at least one active component 126 (e.g., from the switch node). The passive component 106 may be mounted to at least one of the carrier substrate 102 or the circuit substrate 104. For example, the passive component 106 may include a first electrical interconnect 128 (e.g., a first pin) and a second electrical interconnect 130 (e.g., a second pin) that are mounted to and electrically connected with the top main surface 108 of the carrier substrate 102. Accordingly, the passive component 106 may be electrically connected to the circuit substrate 104 by conductive paths formed by the carrier substrate 102 and at least one of the first electrical interconnect 128 or the second electrical interconnect 130.

The first electrical interconnect 128 and the second electrical interconnect 130 may be arranged to straddle the circuit substrate 104. In other words, the circuit substrate 104 may be arranged between the first electrical interconnect 128 and the second electrical interconnect 130 such that the passive component 106 is arranged over the circuit substrate 104.

Alternatively, in some implementations, the passive component 106 may be electrically connected to the circuit substrate 104 by a metal layer formed on the top main surface 120 of the circuit substrate 104. The metal layer may form a connection with the switch node of the circuit substrate 104 and the passive component 106.

In some implementations, the passive component 106 is an inductor having a conductor 132, such as a copper rod, embedded in a magnetic core 134. The conductor 132 has a first end (e.g., a bottom end) which is electrically connected to the switch node and a second end (e.g., a top end) arranged opposite to the first end. The inductor may provide cooling and a low-ohmic current path for the current with minimum parasitic inductance.

The passive component 106 comprises a third plurality of external (e.g., exposed) surfaces 136, 138, 140, and 142. The passive component 106 may be arranged relative to the carrier substrate 102 and/or the circuit substrate 104 to form at least one gap (e.g., at least one internal gap). For example, the passive component may be arranged relative to the circuit substrate 104 to form at least one gap 144 between at least one of the second plurality of external surfaces (e.g., top main surface 120) and at least one of the third plurality of external surfaces (e.g., surface 142).

FIG. 1B shows the electronic module assembly 100B after the electronic module assembly 100A is dipped into a thermally conductive material, which is cured into a thermally conductive structure 146 that is formed as a one-piece integral member. The electronic module assembly 100A may be dipped into the thermally conductive material one or more times to achieve a desired thickness and/or fill ratio. Accordingly, at least one of the first plurality of external surfaces of the carrier substrate 102 is at least partially in contact with the thermally conductive structure 146, at least one of the second plurality of external surfaces of the circuit substrate 104 is at least partially in contact with the thermally conductive structure 146, and at least one of the third plurality of external surfaces of the passive component 106 is at least partially in contact with the thermally conductive structure 146. In addition, the thermally conductive material may at least partially fill the at least one gap 144. Accordingly, the thermally conductive structure 146 is integrally formed as a coating on at least one of the first plurality of external surfaces, at least one of the second plurality of external surfaces, and at least one of the third plurality of external surfaces. In addition, portions of the thermally conductive structure 146 that form the coating are integrally formed as the one-piece integral member with portions of the thermally conductive structure 146 that at least partially fill the at least one gap 144.

In some implementations, the bottom main surface 110 of the carrier substrate 102 may be substantially free from the thermally conductive material such that the contact pads of the carrier substrate 102, including the input contact pad 116 and the output contact pad 118, remain exposed and available for electrical contact with another device.

Because the thermally conductive structure 146 may be formed by dipping the electronic module assembly 100A into a bath or a slurry of the thermally conductive material, the thermally conductive structure 146 that coats one or more surfaces and at least partially fills one or more gaps can be formed as one cohesive, continuous structure. The thermally conductive material may be in a liquid or semi-liquid state that is suitable for dipping. Because the thermally conductive structure 146 is formed as one cohesive, continuous structure, heat generated by the at least one active component 126 can be transported by one or more thermally conductive paths provided by the thermally conductive structure 146. For example, the thermally conductive structure 146 is configured to establish at least one thermal conduit that is configured to transport the heat away from the at least one active component 126 toward a periphery of the electronic module assembly 100B. Cooler areas of the electronic module assembly 100B may use the thermally conductive structure 146 to draw the heat away from the at least one active component 126 to establish a more even distribution of heat throughout the electronic module assembly 100B. The heat may be transported in multiple directions throughout the thermally conductive structure 146. In other words, the thermally conductive structure 146 may form multiple thermal dissipation paths that extend in multiple directions in order to enhance heat dissipation in more directions. Part of the heat may be transported by the thermally conductive structure 146 to a heat sink. Thus, the thermally conductive structure 146 can be used to dissipate heat and improve thermal performance of the electronic module assembly 100B.

In addition, the thermally conductive material is an electrically isolating material that is configured to maintain electrical isolation between components of the electronic module assembly 100B. Thus, the thermally conductive structure 146 may enhance electrical isolation between components of the electronic module assembly 100B and may assist in managing creepage. In addition, the thermally conductive structure 146 may prevent foreign material (e.g., conductive particles) from shorting components (e.g., between the passive component 106 and leads). In other words, by at least partially filling gaps between components of the electronic module assembly, the thermally conductive structure 146 may prevent shorts from forming between the components.

In some implementations, the thermally conductive material may have magnetic shielding properties. Thus, thermally conductive structure 146 may enhance magnetic shielding between components of the electronic module assembly 100B.

In some implementations, the thermally conductive material may be configured to limit solder bleed. Thus, the thermally conductive structure 146 may prevent or reduce solder bleeding, if, for example, solder of the electronic module assembly is remelted during a subsequent manufacturing process or during operation of the electronic module assembly.

In some implementations, the thermally conductive structure 146 may provide the electronic module assembly with environmental protection by sealing at least a portion of the electronic module assembly 100B from the environment.

In some implementations, the thermally conductive structure 146 may enable liquid cooling to be applied to the electronic module assembly 100B while protecting the components of the electronic module assembly 100B from the liquid (e.g., by at least partially sealing the electronic module assembly from the liquid in order to prevent the liquid from coming in contact with the components).

In some implementations, the thermally conductive structure 146 may structurally reinforce the electronic module assembly 100B, which can improve an ability of the electronic module assembly 100B to withstand drops or other types of collisions.

In some implementations, by dipping the electronic module assembly 100A in the bath or the slurry of the thermally conductive material, the thermally conductive structure 146 may completely fill one or more gaps located between components of the electronic module assembly. The thermally conductive coating may be formed by dipping without masking (e.g., taping), thereby simplifying a manufacturing process and lowering costs. In some implementations, the thermally conductive material may be a ceramic material (e.g., an aluminum-based ceramic, an aluminum nitride ceramic, a silicon nitride ceramic, or a silicon carbide ceramic). In some implementations, a silica coated aluminum nitride filler may be used as a core filler of the ceramic material. A liquid phase binder solution may be used to bind ceramic powder together without sintering. In this way, the binder constituents crystalize after drying (e.g., curing) and combine the ceramic powder together. In other words, a binder coating on ceramic powder and a respective liquid solution can be used to fuse ceramic powder together. In some implementations, the liquid phase binder solution may be water, which may advantageously be cured without high temperatures. In some implementations, a binder includes a solid phase, such as an inorganic oxide layer as seed, and a liquid phase, such as a solution of inorganic salt solution for hydrothermal sintering. It will be appreciated that other types of ceramic materials, core fillers, and/or binders may be used for the thermally conductive material and it is not limited to the examples described herein.

In some implementations, a viscosity of the thermally conductive structure 146 may be configured to partially fill one or more gaps or cavities and/or to entirely fill one or more gaps or cavities. For example, increasing the viscosity of the thermally conductive material for a dipping process may enable a higher filling capability, to fill or entirely fill one or more gaps or cavities. In contrast, decreasing the viscosity of the thermally conductive material for the dipping process may decrease the filling capability of the thermally conductive material, but may save on material costs by using less material.

As indicated above, FIGS. 1A and 1B are provided merely as examples. Other examples are possible and may differ from what was described with regard to FIGS. 1A and 1B. The number and arrangement of components shown in FIGS. 1A and 1B are provided as an example. In practice, the electronic module assemblies 100A and 100B may include additional components, fewer components, different components, or differently arranged components than those shown in FIGS. 1A and 1B. Two or more components shown in FIGS. 1A and 1B may be implemented within a single component, or a single component shown in FIGS. 1A and 1B may be implemented as multiple, distributed components. Additionally, or alternatively, a set of components (e.g., one or more components) of the electronic module assemblies 100A and 100B may perform one or more functions described as being performed by another set of components of the electronic module assemblies 100A and 100B.

Figure 2A:
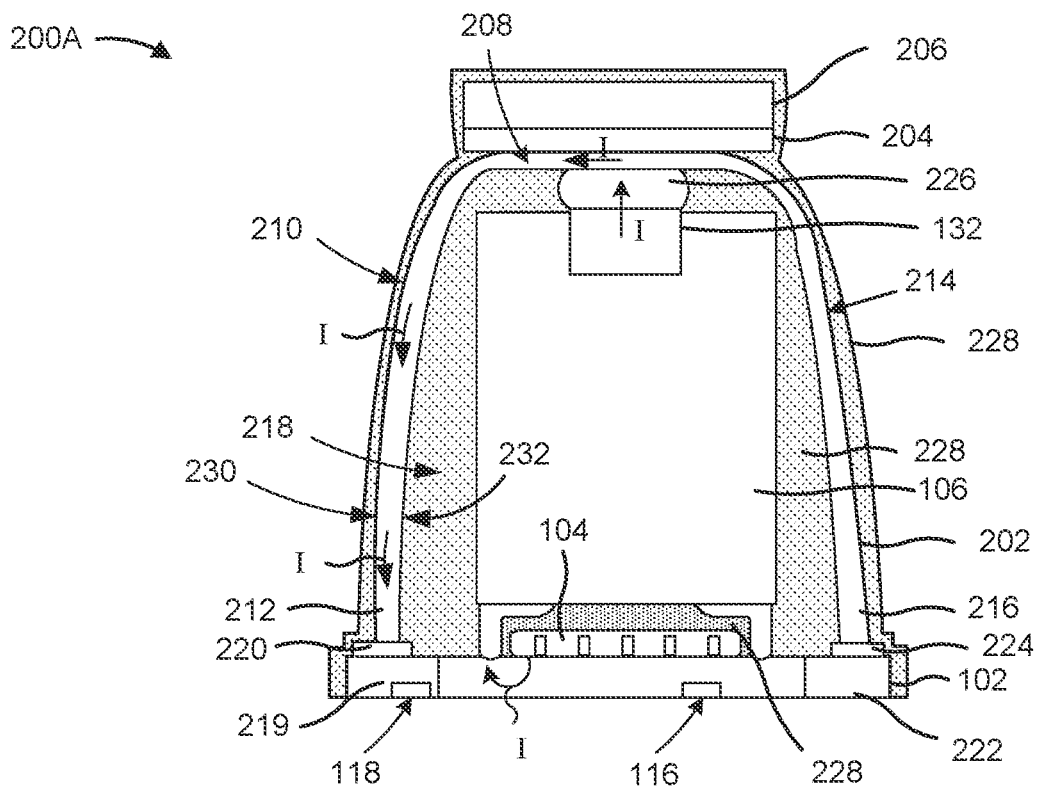
FIG. 2A shows an electronic module assembly according to one or more implementations.

FIG. 2A shows an electronic module assembly 200A according to one or more implementations. The electronic module assembly 200A includes the carrier substrate 102, the circuit substrate 104, and the passive component 106, as similarly described in connection with FIGS. 1A and 1B. Additionally, the electronic module assembly 200A includes a conductor structure 202, a thermal interface material 204 that is electrically insulative, such as a silicone-based or synthetic-based thermal compound, and a heat sink 206.

The conductor structure 202 may have a U-shape. The conductor structure 202 may include a main body 208, a first leg 210 that extends from the main body 208 to a first conductor end 212 of the conductor structure 202, and a second leg 214 that extends from the main body 208 to a second conductor end 216 of the conductor structure 202. In addition, the main body 208, the first leg 210, and the second leg 214 may define an internal area 218 in which the circuit substrate 104 and the passive component 106 are arranged. Surfaces of one or more components of the electronic module assembly 200A that are located inside the internal area 218 that are exposed for contact with a thermally conductive material during dipping may be referred to as "internal exposed surfaces." Surfaces of one or more components of the electronic module assembly 200A that are located outside of the internal area 218 that are exposed for contact with a thermally conductive material during dipping may be referred to as "external exposed surfaces."

The first conductor end 212 of the conductor structure 202 may be coupled to a first peripheral region 219 of the carrier substrate 102 by a first contact structure 220. The first contact structure 220 may be made of an electrically conductive material (e.g., metal) that forms an electrical connection with the first conductor end 212 of the conductor structure 202 and the carrier substrate 102. The second conductor end 216 of the conductor structure 202 may be coupled to a second peripheral region 222 of the carrier substrate 102 by a second contact structure 224. The second contact structure 224 may be made of an electrically conductive material (e.g., metal) that forms an electrical connection with the second conductor end 216 of the conductor structure 202 and the carrier substrate 102. The first peripheral region 219 and the second peripheral region 222 are arranged at opposite sides of the carrier substrate 102.

The conductor structure 202 may be a metal clip. The conductor structure 202 may cover the power stage of the electronic module assembly 200A and form an electromagnetic shield for the passive component 106 (e.g., an inductor) and the active components 126 of the power stage. For example, the conductor structure 202 may be configured as a Faraday cage for potentially disturbing electro-magnetic emissions, for example, from switching of the power switches included in the power stage.

The second end (e.g., the top end) of the conductor 132 may be electrically coupled to the main body 208 of the conductor structure 202. For example, a coupling structure 226, such as solder, an electrically conductive adhesive, or an electrically conductive paste, may be interposed between and in contact with the main body 208 of the conductor structure 202 and the second end (e.g., the top end) of the conductor 132, to electrically couple the second end (e.g., the top end) of the conductor 132 and the main body 208 of the conductor structure 202.

The passive component 106 may receive a current/(e.g., a phase current) from the switch node of the circuit substrate 104. For example, the conductor 132 of the passive component 106 may receive the current/from an electrical path formed through the circuit substrate 104, the carrier substrate 102, and the second electrical interconnect 130 of the passive component.

As described in connection with FIGS. 1A and 1B, the current/may be derived from the input voltage provided to the input contact pad 116. The conductor 132 of the passive component 106 may provide the current/to the conductor structure 202, and the conductor structure 202 may provide the current to the output contact pad 118 of the carrier substrate 102. Accordingly, the current flows through the conductor 132 of the passive component 106, through the coupling structure 226, through part of the main body 208 of the conductor structure 202, through the first leg 210 of the conductor structure 202, through the first contact structure 220, and through the first peripheral region of the carrier substrate 102 to the output contact pad 118. The current/is output from the electronic module assembly 200A as an output current by the output contact pad 118. In some implementations, the output current exits the electronic module assembly 200A at the output contact pad 118 and is routed back to the input contact pad 116 by a low-ohmic path.

Accordingly, the passive component 106 may provide cooling and a low-ohmic current path for the current/with minimum parasitic inductance. Thus, the conductor structure 202 electrically connects the second end (e.g., the top end) of the conductor 132 of the passive component 106 (e.g., an inductor) to the power output terminal located at the output contact pad 118 such that input power is delivered to the electronic module assembly 200A at the input contact pad 116 and output power is delivered from the electronic module assembly 200A at the output contact pad 118 at a same side (e.g., the bottom main surface 110) of the electronic module assembly 200A. The heat sink 206 may be in thermal contact with the main body of the conductor structure 202. The heat sink 206 may be air cooled or liquid cooled. In some implementations, the heat sink 206 may be electrically isolated from the conductor structure 202 by the thermal interface material 204. The active components 126 may be cooled through the conductor structure 202 coupling the switch node to the passive component 106 and through the passive component 106 toward the heat sink 206 attached to an opposite side of the electronic module assembly 200A from the side with the input contact pad 116 and the output contact pad 118.

The electronic module assembly 200A may be dipped into a thermally conductive material one or more times, as similarly described in connection with FIGS. 1A and 1B, which is cured to form a thermally conductive structure 228. Accordingly, at least one of the first plurality of external surfaces of the carrier substrate 102 is at least partially in contact with the thermally conductive structure 228, at least one of the second plurality of external surfaces of the circuit substrate 104 is at least partially in contact with the thermally conductive structure 228, and at least one of the third plurality of external surfaces of the passive component 106 is at least partially in contact with the thermally conductive structure 228. In addition, the conductor structure 202 includes a fourth plurality of external surfaces, including surfaces 230 and 232. At least one of the fourth plurality of external surfaces of the thermally conductive structure 228 is at least partially in contact with the thermally conductive structure 228. In addition, the thermally conductive material of the thermally conductive structure 228 may at least partially fill the gap 144. In addition, the thermally conductive material of the thermally conductive structure 228 may at least partially fill the internal area 218. In some implementations, the thermally conductive structure 228 may entirely fill the gap 144. In some implementations, the thermally conductive structure 228 may entirely fill the internal area 218. In some implementations, the thermally conductive structure 228 may coat all surfaces that are exposed during dipping, with the exception of the bottom main surface 110 of the carrier substrate 102, such that the contact pads are not covered by the thermally conductive material of the thermally conductive structure 228.

Because the thermally conductive structure 228 may be formed by dipping the electronic module assembly 200A into a bath or a slurry of the thermally conductive material, the thermally conductive structure 228 that coats one or more surfaces and at least partially fills one or more gaps can be formed as one cohesive, continuous structure. Because the thermally conductive structure 228 is formed as one cohesive, continuous structure, heat generated by the at least one active component 126 can be transported by one or more thermally conductive paths provided by the thermally conductive structure 228. For example, the thermally conductive structure 228 is configured to establish at least one thermal conduit that is configured to transport the heat away from the at least one active component 126 toward a periphery of the electronic module assembly 200A. Cooler areas of the electronic module assembly 200A may use the thermally conductive structure 228 to draw the heat away from the at least one active component 126 to establish a more even distribution of heat throughout the electronic module assembly 200A. The heat may be transported in multiple directions throughout the thermally conductive structure 228. In other words, the thermally conductive structure 228 may form multiple thermal dissipation paths that extend in multiple directions in order to enhance heat dissipation in more directions. Part of the heat may be transported by the thermally conductive structure 228 to the conductor structure 202 and/or to the heat sink 206. The conductor structure 202 may also be configured to further distribute heat, received from the thermally conductive structure 228, to cooler areas of the electronic module assembly 200A, including to cooler portions of the conductor structure 202 and/or to the heat sink 206. Thus, the thermally conductive structure 228 can be used to dissipate heat and improve thermal performance of the electronic module assembly 200A.

As indicated above, FIG. 2A is provided merely as an example. Other examples are possible and may differ from what was described with regard to FIG. 2A. The number and arrangement of components shown in FIG. 2A are provided as an example. In practice, the electronic module assembly 200A may include additional components, fewer components, different components, or differently arranged components than those shown in FIG. 2A. Two or more components shown in FIG. 2A may be implemented within a single component, or a single component shown in FIG. 2A may be implemented as multiple, distributed components. Additionally, or alternatively, a set of components (e.g., one or more components) of the electronic module assembly 200A may perform one or more functions described as being performed by another set of components of the electronic module assembly 200A.

Figure 2B:
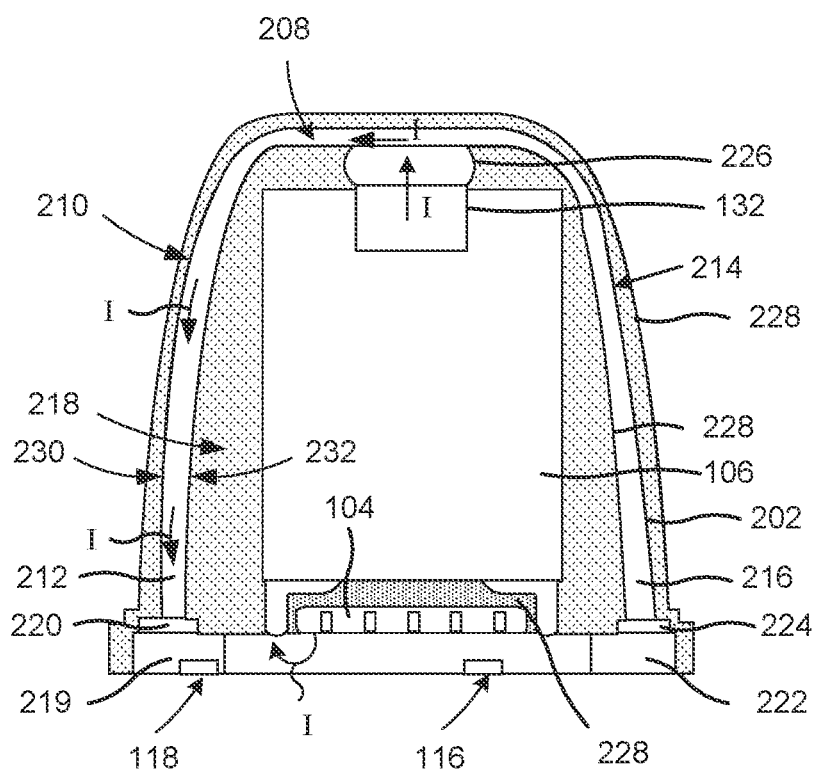
FIG. 2B shows an electronic module assembly according to one or more implementations.

FIG. 2B shows an electronic module assembly 200B according to one or more implementations. The electronic module assembly 200B is similar to the electronic module assembly 200A described in connection with FIG. 2A, with the exception that the electronic module assembly 200B does not include the thermal interface material 204 or the heat sink 206. Accordingly, the thermally conductive structure 228 may be in contact with a top portion of the conductor structure 202.

In some implementations, the thermal interface material 204 and/or the heat sink 206 may be disposed on top of the thermally conductive structure 228.

FIG. 2B is provided merely as an example. Other examples are possible and may differ from what was described with regard to FIG. 2B. The number and arrangement of components shown in FIG. 2B are provided as an example. In practice, the electronic module assembly 200B may include additional components, fewer components, different components, or differently arranged components than those shown in FIG. 2B. Two or more components shown in FIG. 2B may be implemented within a single component, or a single component shown in FIG. 2B may be implemented as multiple, distributed components. Additionally, or alternatively, a set of components (e.g., one or more components) of the electronic module assembly 200B may perform one or more functions described as being performed by another set of components of the electronic module assembly 200B.

Figure 3A:
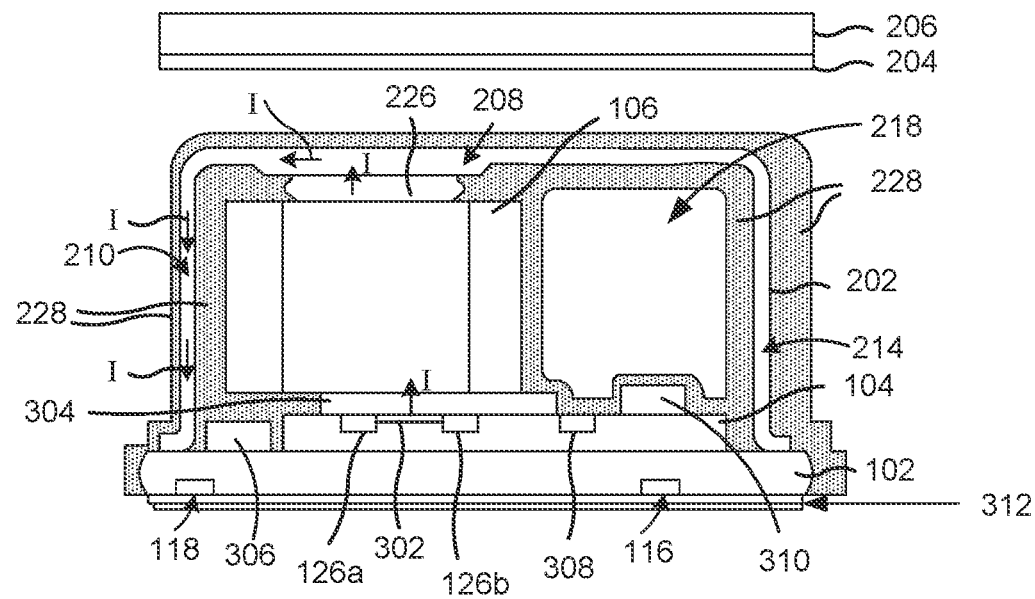
FIGS. 3A and 3B show an electronic module assembly according to one or more implementations.
Figure 3B:
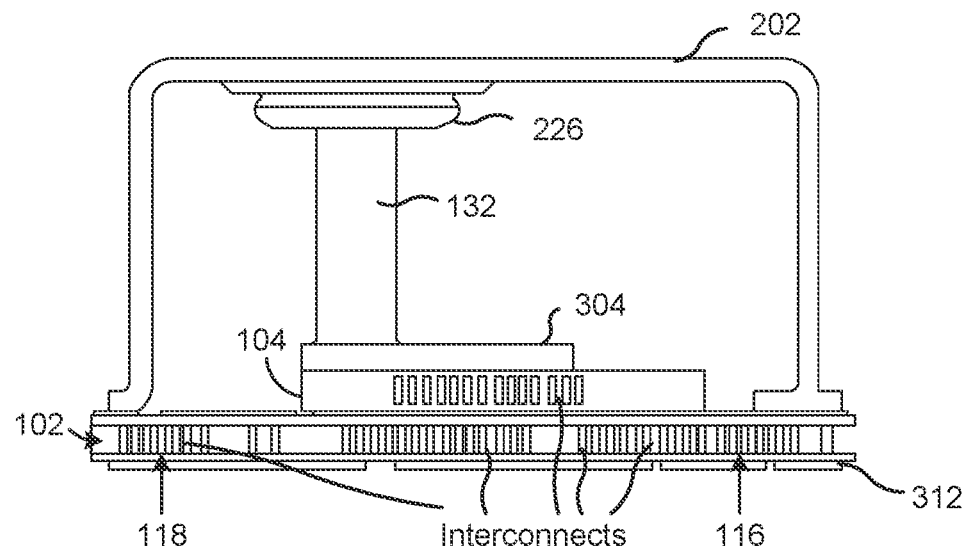

FIG. 3A shows an electronic module assembly 300 according to one or more implementations. FIG. 3B shows the electronic module assembly 300 according to one or more implementations, with some aspects removed to provide visibility to some components that are hidden from view in FIG. 3A, such as conductive interconnects and the conductor 132 of the passive component 106.

The electronic module assembly 300 includes the carrier substrate 102, the circuit substrate 104, and the passive component 106 (e.g., an inductor), as similarly described in connection with FIGS. 1A and 1B. Additionally, the electronic module assembly 300 includes the conductor structure 202, the internal area 218, and the thermally conductive structure 228, as similarly described in connection with FIGS. 2A and 2B. Additionally, the electronic module assembly 300 may include the thermal interface material 204 and the heat sink 206 disposed on the thermally conductive structure 228 in a region of the thermally conductive structure 228 that is formed on top of the main body 208 of the conductor structure 202.

The circuit substrate 104 includes a first active component 126a (e.g., a high-side power transistor) and a second active component 126b (e.g., a low-side power transistor) that are coupled by switch node 302 to form a transistor half-bridge.

The electronic module assembly 300 may include a metallization layer 304 formed on the top main surface 120 of the circuit substrate 104. The metallization layer 304 is arranged between the circuit substrate 104 and the passive component 106. In particular, the metallization layer 304 is electrically coupled to the switch node 302 and the conductor 132 of the passive component 106, and is configured to provide an electrical path for the current/to flow from the switch node 302 to the conductor 132 of the passive component 106.

The electronic module assembly 300 may include additional circuit components 306, 308, and/or 310. For example, each of the additional circuit components 306, 308, and/or 310 may be a passive component (e.g., a capacitor or a resistor) or an active component. The additional circuit component 306 may be coupled to the top main surface 108 of the carrier substrate 102. The additional circuit component 308 may be embedded in the circuit substrate 104. The additional circuit component 310 may be coupled to the top main surface 120 of the circuit substrate 104. Each of the additional circuit components 306, 308, and/or 310 may be in contact with the thermally conductive structure 228.

The electronic module assembly 300 may include an interface 312 coupled to the bottom main surface 110 of the carrier substrate 102. The interface 312 may receive the output current from the output contact pad 118 and may provide a low-ohmic path for routing the output current back to the input contact pad 116.

The thermally conductive structure 228 is formed on one or more surfaces of the electronic module assembly 300 and at least partially fills one or more gaps between components of the electronic module assembly 300. The thermally conductive structure 228 may partially fill or completely fill the internal area 218. In some implementations, the thermally conductive structure 228 may fill small gaps or small cavities and may only partially fill large gaps or large cavities.

As indicated above, FIGS. 3A and 3B are provided merely as examples. Other examples are possible and may differ from what was described with regard to FIGS. 3A and 3B. The number and arrangement of components shown in FIGS. 3A and 3B are provided as an example. In practice, the electronic module assembly 300 may include additional components, fewer components, different components, or differently arranged components than those shown in FIGS. 3A and 3B. Two or more components shown in FIGS. 3A and 3B may be implemented within a single component, or a single component shown in FIGS. 3A and 3B may be implemented as multiple, distributed components. Additionally, or alternatively, a set of components (e.g., one or more components) of the electronic module assembly 300 may perform one or more functions described as being performed by another set of components of the electronic module assembly 300.

Figure 4:
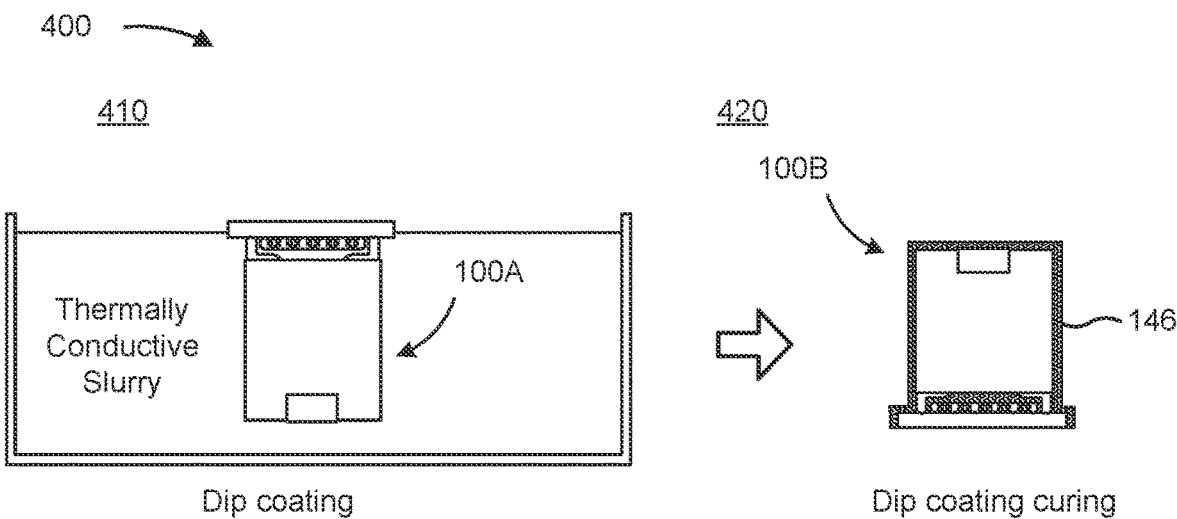
FIG. 4 shows a flow diagram of a process according to one or more implementations.

FIG. 4 shows a flow diagram of a process 400 according to one or more implementations. The process 400 may be used to manufacture one of the electronic module assemblies described herein, including electronic module assembly 100B, 200A, 200B, or 300. In this example, the electronic module assemblies 100A and 100B are illustrated. After the components of the electronic module assembly 100A are assembled, the electronic module assembly 100A is partially dipped into a thermally conductive slurry or a thermally conductive liquid of a thermally conductive material to coat one or more of a plurality of internal exposed surfaces and one or more of a plurality of external exposed surfaces of the electronic module assembly 100A with the thermally conductive material (step 410).

In some implementations, the electronic module assembly 100A may be dipped into the thermally conductive material with the bottom main surface 110 of the carrier substrate 102 facing out of the thermally conductive material to prevent the contact pads provided at the bottom main surface 110 from being covered in the thermally conductive material. In addition, during step 410 at least one internal gap or cavity of the electronic module assembly 100A is at least partially filled with the thermally conductive material.

In some implementations, step 410 may be repeated one or more times such that the electronic module assembly 100A may be dipped into the thermally conductive material multiple times to increase a thickness of the coating and/or to increase a fill ratio of one or more internal gaps or cavities.

In step 420, the electronic module assembly 100A is pulled out of the thermally conductive material and the thermally conductive material formed on the electronic module assembly 100A is cured to form the electronic module assembly 100B that includes the thermally conductive structure 146. The thermally conductive structure 146 is formed as a one-piece integral member, as described herein. The thermally conductive structure 146 is contiguously formed as a coating that is in contact with the exposed surfaces and as a filler that at least partially filled at least one gap or cavity. A viscosity of the thermally conductive material may be high enough that the exposed surfaces of the electronic module assembly 100A remain coated with the thermally conductive material and the at least one internal gap or cavity of the electronic module assembly 100A remains at least partially filled with the thermally conductive material. The thermally conductive material formed on the electronic module assembly 100A is cured by a drying process, which may include an application of heat to accelerate the curing process.

In some implementations, additional processing steps may be performed to fill or partially fill any remaining gaps. For example, an additional thermally conductive material may be deposited, injected, or otherwise formed within one or more remaining internal gaps or cavities to at least partially fill or completely fill up the remaining internal gaps or cavities within electronic module assembly 100B. For example, plating may be performed to at least partially fill or completely fill up the remaining internal gaps or cavities within electronic module assembly 100B with the additional thermally conductive material. The additional thermally conductive material may be used to enhance heat dissipation and improve thermal performance of the electronic module assembly 100B.

Although FIG. 4 shows example blocks of process 400, in some implementations, process 400 includes additional steps, fewer steps, different steps, or differently arranged steps than those depicted in FIG. 4.

Figure 5:
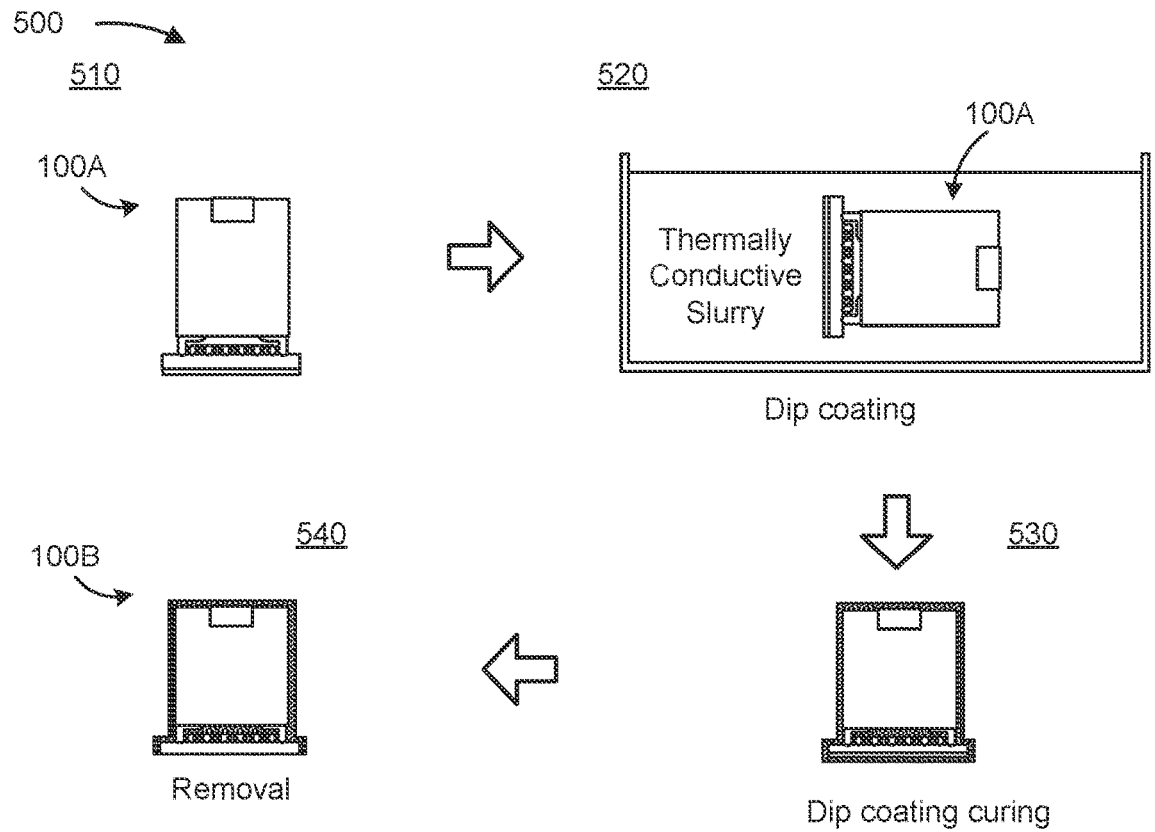
FIG. 5 shows a flow diagram of a process according to one or more implementations.

FIG. 5 shows a flow diagram of a process 500 according to one or more implementations. The process 500 may be used to manufacture one of the electronic module assemblies described herein, including electronic module assembly 100B, 200A, 200B, or 300. In this example, the electronic module assemblies 100A and 100B are illustrated.

In step 510, the components of the electronic module assembly 100A are assembled.

In step 520, the electronic module assembly 100A is fully dipped (e.g., fully submerged) into a thermally conductive slurry or a thermally conductive liquid of a thermally conductive material to coat one or more of a plurality of internal exposed surfaces and one or more of a plurality of external exposed surfaces of the electronic module assembly 100A with the thermally conductive material. In addition, during step 520, at least one internal gap or cavity of the electronic module assembly 100A is at least partially filled with the thermally conductive material. In some implementations, step 520 may be repeated one or more times such that the electronic module assembly 100A may be dipped into the thermally conductive material multiple times to increase a thickness of the coating and/or to increase a fill ratio of one or more internal gaps or cavities.

In step 530, the electronic module assembly 100A is pulled out of the thermally conductive material and the thermally conductive material formed on the electronic module assembly 100A is cured to form the electronic module assembly 100B that includes the thermally conductive structure 146. The thermally conductive structure 146 is formed as a one-piece integral member, as described herein. The thermally conductive structure 146 is contiguously formed as a coating that is in contact with the exposed surfaces and as a filler that at least partially fills at least one gap or cavity. A viscosity of the thermally conductive material may be high enough that the exposed surfaces of the electronic module assembly 100A remain coated with the thermally conductive material and the at least one internal gap or cavity of the electronic module assembly 100A remains at least partially filled with the thermally conductive material. The thermally conductive material formed on the electronic module assembly 100A is cured by a drying process, which may include an application of heat to accelerate the curing process.

In step 540, the thermally conductive structure 146 is removed from the bottom main surface 110 of the carrier substrate 102 to expose the contact pads, including the input contact pad 116 and the output contact pad 118.

In some implementations, additional processing steps may be performed to fill or partially fill any remaining gaps. For example, an additional thermally conductive material may be deposited, injected, or otherwise formed within one or more remaining internal gaps or cavities to at least partially fill or completely fill up the remaining internal gaps or cavities within electronic module assembly 100B. For example, plating may be performed to at least partially fill or completely fill up the remaining internal gaps or cavities within electronic module assembly 100B with the additional thermally conductive material. The additional thermally conductive material may be used to enhance heat dissipation and improve thermal performance of the electronic module assembly 100B.

Although FIG. 5 shows example blocks of process 500, in some implementations, process 500 includes additional steps, fewer steps, different steps, or differently arranged steps than those depicted in FIG. 5.

The following provides an overview of some Aspects of the present disclosure:

Aspect 1: An electronic module assembly, comprising: a thermally conductive material formed as a one-piece integral member; a carrier substrate comprising a first plurality of external surfaces, wherein at least one of the first plurality of external surfaces is at least partially in contact with the thermally conductive material; a circuit substrate mounted to the carrier substrate, wherein the circuit substrate comprises a second plurality of external surfaces, wherein at least one of the second plurality of external surfaces is at least partially in contact with the thermally conductive material, wherein the circuit substrate comprises at least one active component configured to conduct a current, and wherein the at least one active component is electrically coupled to the carrier substrate and is configured to produce heat while conducting the current; and a passive component electrically coupled to the at least one active component and configured to conduct the current, wherein the passive component is mounted to at least one of the carrier substrate or the circuit substrate, and wherein the passive component comprises a third plurality of external surfaces, wherein at least one of the third plurality of external surfaces is at least partially in contact with the thermally conductive material, wherein the passive component is arranged relative to the circuit substrate to form at least one gap between at least one of the second plurality of external surfaces and at least one of the third plurality of external surfaces, wherein the thermally conductive material is integrally formed as a coating on the first plurality of external surfaces, the second plurality of external surfaces, and the third plurality of external surfaces, and integrally formed with the coating as the one-piece integral member to at least partially fill the at least one gap, and wherein the thermally conductive material is configured to establish at least one thermal conduit that is configured to transport the heat away from the at least one active component toward a periphery of the electronic module assembly.

Aspect 2: The electronic module assembly of Aspect 1, further comprising: at least one heat sink, wherein the at least one thermal conduit is configured to transport the heat away from the at least one active component to the at least one heat sink.

Aspect 3: The electronic module assembly of Aspect 3, wherein: the at least one gap is at least one first gap, at least one second gap is formed between the at least one active component and the at least one heat sink, and the thermally conductive material is contiguously formed with the coating to fill the at least one second gap.

Aspect 4: The electronic module assembly of any of Aspects 1-3, wherein the thermally conductive material is an electrically isolating material.

Aspect 5: The electronic module assembly of any of Aspects 1-4, wherein the circuit substrate includes a power stage comprising the at least one active component.

Aspect 6: The electronic module assembly of Aspect 5, wherein the power stage comprises a transistor half-bridge and driving circuitry configured to drive the transistor half-bridge.

Aspect 7: The electronic module assembly of any of Aspects 1-6, wherein: the passive component is mounted to a surface of the second plurality of external surfaces of the carrier substrate by a first plurality of electrical interconnects, wherein the first plurality of electrical interconnects includes a first subset of electrical interconnects and a second subset of electrical interconnects, wherein the circuit substrate is straddled between the first subset of electrical interconnects and the second subset of electrical interconnects.

Aspect 8: The electronic module assembly of Aspect 7, wherein the circuit substrate is arranged relative to the passive component such that the at least one gap is formed between the circuit substrate and the passive component.

Aspect 9: The electronic module assembly of Aspect 7, wherein the circuit substrate is surface mounted to the surface of the carrier substrate by a second plurality of electrical interconnects.

Aspect 10: The electronic module assembly of any of Aspects 1-9, further comprising: a conductor structure having a U-shape, the conductor structure comprising a main body, a first leg that extends from the main body to a first conductor end of the conductor structure, and a second leg that extends from the main body to a second conductor end of the conductor structure, wherein the main body, the first leg, and the second leg define an internal area, wherein the carrier substrate comprises a first peripheral region and a second peripheral region arranged opposite to the first peripheral region, wherein the first conductor end of the conductor structure is coupled to the first peripheral region of the carrier substrate, wherein the second conductor end of the conductor structure is coupled to the second peripheral region of the carrier substrate, and wherein the circuit substrate and the passive component are arranged within the internal area.

Aspect 11: The electronic module assembly of Aspect 10, wherein the conductor structure is in contact with the thermally conductive material, wherein the at least one thermal conduit is configured to transport a portion of the heat to the conductor structure.

Aspect 12: The electronic module assembly of Aspect 10, wherein the conductor structure includes a fourth plurality of external surfaces, wherein at least one of the fourth plurality of external surfaces is at least partially in contact with the thermally conductive material, wherein the thermally conductive material is integrally formed as part of the coating on the at least one of the fourth plurality of external surfaces.

Aspect 13: The electronic module assembly of Aspect 12, wherein the thermally conductive material is integrally formed with the coating as the one-piece integral member to fill the internal area.

Aspect 14: The electronic module assembly of Aspect 10, further comprising: a heat sink in thermal contact with the main body of the conductor structure.

Aspect 15: The electronic module assembly of Aspect 10, further wherein the main body of the conductor structure is electrically connected to the passive component and is configured to conduct the current.

Aspect 16: An electronic module assembly, comprising: a thermally conductive material formed as a one-piece integral member; a carrier substrate comprising a first plurality of external surfaces, wherein at least one of the first plurality of external surfaces is at least partially in contact with the thermally conductive material; a circuit substrate mounted to the carrier substrate, wherein the circuit substrate comprises a second plurality of external surfaces, wherein at least one of the second plurality of external surfaces is at least partially in contact with the thermally conductive material, wherein the circuit substrate comprises at least one active component electrically coupled to the carrier substrate and configured to produce heat while operating; and a conductor structure having a U-shape, the conductor structure comprising a main body, a first leg that extends from the main body to a first conductor end of the conductor structure, and a second leg that extends from the main body to a second conductor end of the conductor structure, wherein the main body, the first leg, and the second leg define an internal area, and wherein the conductor structure includes a third plurality of external surfaces, wherein the carrier substrate comprises a first peripheral region and a second peripheral region arranged opposite to the first peripheral region, wherein the first conductor end of the conductor structure is coupled to the first peripheral region of the carrier substrate, wherein the second conductor end of the conductor structure is coupled to the second peripheral region of the carrier substrate, wherein the circuit substrate is arranged within the internal area, wherein the thermally conductive material is integrally formed as a coating on the at least one of the first plurality of external surfaces, the at least one of the second plurality of external surfaces, and at least one of the third plurality of external surfaces, and wherein the thermally conductive material is configured to establish at least one thermal conduit that is configured to transport the heat away from the at least one active component to the conductor structure.

Aspect 17: A method of manufacturing an electronic module assembly, the method comprising: forming the electronic module assembly, wherein the electronic module assembly comprises a plurality of internal exposed surfaces, a plurality of external exposed surfaces, at least one internal cavity, and an internal heat source configured to generate heat internally within the electronic module assembly; dipping the electronic module assembly into a thermally conductive material to coat the plurality of internal exposed surfaces and the plurality of external exposed surfaces and to at least partially fill the at least one internal cavity; and curing the thermally conductive material formed on the plurality of internal exposed surfaces and the plurality of external exposed surfaces and filled within the at least one internal cavity to form a thermally conductive layer, wherein the thermally conductive layer is formed as a one-piece integral member. The thermally conductive material may be a thermally conductive slurry or a flowable thermally conductive liquid.

Aspect 18: The method of Aspect 17, wherein forming the electronic module assembly comprises: forming a circuit substrate onto a carrier substrate, wherein the carrier substrate comprises a first peripheral region and a second peripheral region arranged opposite to the first peripheral region, and wherein the circuit substrate comprises the internal heat source; and coupling a conductor structure to the carrier substrate, wherein the conductor structure has a U-shape, the conductor structure comprising a main body, a first leg that extends from the main body to a first conductor end of the conductor structure, and a second leg that extends from the main body to a second conductor end of the conductor structure, wherein the main body, the first leg, and the second leg define an internal area, and wherein coupling the conductor structure to the carrier substrate includes coupling the first conductor end of the conductor structure to the first peripheral region of the carrier substrate and coupling the second conductor end of the conductor structure to the second peripheral region of the carrier substrate such that the circuit substrate is arranged within the internal area.

Aspect 19: The method of Aspect 18, wherein forming the electronic module assembly comprises: electrically connecting the conductor structure to the circuit substrate.

Aspect 20: The method of Aspect 18, wherein: the plurality of internal exposed surfaces and the plurality of external exposed surfaces are formed by exposed surfaces of the circuit substrate, the carrier substrate, and the conductor structure, and the thermally conductive layer coats the conductor structure and fills at least part of the internal area.

Aspect 21: The method of Aspect 20, wherein the least one internal cavity includes the internal area.

Aspect 22: The method of any of Aspects 17-21, wherein the electronic module assembly comprises a plurality of contact pads arranged at a surface of the plurality of external exposed surfaces, and the method further comprises: removing a portion of the thermally conductive layer from the surface to expose the plurality of contact pads.

Aspect 23: The method of any of Aspects 17-22, wherein the thermally conductive material is an electrically isolating material.

Aspect 24: A system configured to perform one or more operations recited in one or more of Aspects 17-23.

Aspect 25: An apparatus comprising means for performing one or more operations recited in one or more of Aspects 17-23.

Aspect 26: A non-transitory computer-readable medium storing a set of instructions, the set of instructions comprising one or more instructions that, when executed by a device, cause the device to perform one or more operations recited in one or more of Aspects 17-23.

Aspect 27: A computer program product comprising instructions or code for executing one or more operations recited in one or more of Aspects 17-23.

The foregoing disclosure provides illustration and description but is not intended to be exhaustive or to limit the implementations to the precise forms disclosed. Modifications and variations may be made in light of the above disclosure or may be acquired from practice of the implementations described herein.

Each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "top," "bottom," "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

As used herein, the terms "substantially" and "approximately" mean "within reasonable tolerances of manufacturing and measurement." For example, the terms "substantially" and "approximately" may be used herein to account for small manufacturing tolerances or other factors (e.g., within 5%) that are deemed acceptable in the industry without departing from the aspects of the implementations described herein. For example, a resistor with an approximate resistance value may practically have a resistance within 5% of the approximate resistance value. As another example, an approximate signal value may practically have a signal value within 5% of the approximate signal value.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. An electronic module assembly, comprising:
    a thermally conductive material formed as a one-piece integral member;
    a carrier substrate comprising a first plurality of external surfaces, wherein at least one of the first plurality of external surfaces is at least partially in contact with the thermally conductive material;
    a circuit substrate mounted to the carrier substrate, wherein the circuit substrate comprises a second plurality of external surfaces, wherein at least one of the second plurality of external surfaces is at least partially in contact with the thermally conductive material, wherein the circuit substrate comprises at least one active component configured to conduct a current, and wherein the at least one active component is electrically coupled to the carrier substrate and is configured to produce heat while conducting the current; and
    a passive component electrically coupled to the at least one active component and configured to conduct the current, wherein the passive component is mounted to at least one of the carrier substrate or the circuit substrate, and wherein the passive component comprises a third plurality of external surfaces, wherein at least one of the third plurality of external surfaces is at least partially in contact with the thermally conductive material,
    wherein the passive component is arranged relative to the circuit substrate to form at least one gap between at least one of the second plurality of external surfaces and at least one of the third plurality of external surfaces,
    wherein the thermally conductive material is integrally formed as a coating on the first plurality of external surfaces, the second plurality of external surfaces, and the third plurality of external surfaces, and integrally formed with the coating as the one-piece integral member to at least partially fill the at least one gap, and
    wherein the thermally conductive material is configured to establish at least one thermal conduit that is configured to transport the heat away from the at least one active component toward a periphery of the electronic module assembly.

2. The electronic module assembly of claim 1, further comprising:
    at least one heat sink,
    wherein the at least one thermal conduit is configured to transport the heat away from the at least one active component to the at least one heat sink.

3. The electronic module assembly of claim 2, wherein:
    the at least one gap is at least one first gap,
    at least one second gap is formed between the at least one active component and the at least one heat sink, and
    the thermally conductive material is contiguously formed with the coating to fill the at least one second gap.

4. The electronic module assembly of claim 1, wherein the thermally conductive material is an electrically isolating material.

5. The electronic module assembly of claim 1, wherein the circuit substrate includes a power stage comprising the at least one active component.

6. The electronic module assembly of claim 5, wherein the power stage comprises a transistor half-bridge and driving circuitry configured to drive the transistor half-bridge.

7. The electronic module assembly of claim 1, wherein:
    the passive component is mounted to a surface of the second plurality of external surfaces of the carrier substrate by a first plurality of electrical interconnects, wherein the first plurality of electrical interconnects includes a first subset of electrical interconnects and a second subset of electrical interconnects, wherein the circuit substrate is straddled between the first subset of electrical interconnects and the second subset of electrical interconnects.

8. The electronic module assembly of claim 7, wherein the circuit substrate is arranged relative to the passive component such that the at least one gap is formed between the circuit substrate and the passive component.

9. The electronic module assembly of claim 7, wherein the circuit substrate is surface mounted to the surface of the carrier substrate by a second plurality of electrical interconnects.

10. The electronic module assembly of claim 1, further comprising:
- a conductor structure having a U-shape, the conductor structure comprising a main body, a first leg that extends from the main body to a first conductor end of the conductor structure, and a second leg that extends from the main body to a second conductor end of the conductor structure, wherein the main body, the first leg, and the second leg define an internal area,
- wherein the carrier substrate comprises a first peripheral region and a second peripheral region arranged opposite to the first peripheral region,
- wherein the first conductor end of the conductor structure is coupled to the first peripheral region of the carrier substrate,
- wherein the second conductor end of the conductor structure is coupled to the second peripheral region of the carrier substrate, and
- wherein the circuit substrate and the passive component are arranged within the internal area.

11. The electronic module assembly of claim 10, wherein the conductor structure is in contact with the thermally conductive material, wherein the at least one thermal conduit is configured to transport a portion of the heat to the conductor structure.

12. The electronic module assembly of claim 10, wherein the conductor structure includes a fourth plurality of external surfaces, wherein at least one of the fourth plurality of external surfaces is at least partially in contact with the thermally conductive material, wherein the thermally conductive material is integrally formed as part of the coating on the at least one of the fourth plurality of external surfaces.

13. The electronic module assembly of claim 12, wherein the thermally conductive material is integrally formed with the coating as the one-piece integral member to fill the internal area.

14. The electronic module assembly of claim 10, further comprising:
- a heat sink in thermal contact with the main body of the conductor structure.

15. The electronic module assembly of claim 10, further wherein the main body of the conductor structure is electrically connected to the passive component and is configured to conduct the current.

16. An electronic module assembly, comprising:
- a thermally conductive material formed as a one-piece integral member;
- a carrier substrate comprising a first plurality of external surfaces, wherein at least one of the first plurality of external surfaces is at least partially in contact with the thermally conductive material;
- a circuit substrate mounted to the carrier substrate, wherein the circuit substrate comprises a second plurality of external surfaces, wherein at least one of the second plurality of external surfaces is at least partially in contact with the thermally conductive material, wherein the circuit substrate comprises at least one active component electrically coupled to the carrier substrate and configured to produce heat while operating; and
- a conductor structure having a U-shape, the conductor structure comprising a main body, a first leg that extends from the main body to a first conductor end of the conductor structure, and a second leg that extends from the main body to a second conductor end of the conductor structure, wherein the main body, the first leg, and the second leg define an internal area, and wherein the conductor structure includes a third plurality of external surfaces,
- wherein the carrier substrate comprises a first peripheral region and a second peripheral region arranged opposite to the first peripheral region,
- wherein the first conductor end of the conductor structure is coupled to the first peripheral region of the carrier substrate,
- wherein the second conductor end of the conductor structure is coupled to the second peripheral region of the carrier substrate,
- wherein the circuit substrate is arranged within the internal area,
- wherein the thermally conductive material is integrally formed as a coating on the at least one of the first plurality of external surfaces, the at least one of the second plurality of external surfaces, and at least one of the third plurality of external surfaces, and
- wherein the thermally conductive material is configured to establish at least one thermal conduit that is configured to transport the heat away from the at least one active component to the conductor structure.

* * * * *